US006083663A

United States Patent [19]

Vermeersch et al.

[11] Patent Number: 6,083,663

[45] Date of Patent: Jul. 4, 2000

[54] METHOD FOR MAKING POSITIVE WORKING PRINTING PLATES FROM A HEAT MODE SENSITIVE IMAGE ELEMENT

[75] Inventors: Joan Vermeersch, Deinze; Marc Van Damme, Heverlee; Guido Hauquier, Nijlen; Eric Verschueren, Merksplas, all of Belgium

[73] Assignee: Agfa-Gevaert, N.V., Mortsel, Belgium

[21] Appl. No.: 09/161,469

[22] Filed: Sep. 28, 1998

Related U.S. Application Data

[60] Provisional application No. 60/069,954, Dec. 17, 1997.

[30] Foreign Application Priority Data

Oct. 8, 1997 [EP] European Pat. Off. .............. 97203127

[51] Int. Cl.[7] ...................... G03F 7/004

[52] U.S. Cl. .................... 430/302; 430/270.1; 430/273.1

[58] Field of Search ................ 430/270.1, 302, 430/273.1

[56] References Cited

U.S. PATENT DOCUMENTS

| | | | |
|---|---|---|---|
| 4,626,493 | 12/1986 | Butters et al. . | |
| 4,740,450 | 4/1988 | Tamaoki et al. | 430/273 |
| 4,897,499 | 1/1990 | Hutton et al. . | |
| 4,946,758 | 8/1990 | Kurtz et al. . | |
| 5,283,161 | 2/1994 | Toya et al. | 430/375 |
| 5,411,845 | 5/1995 | Robinson . | |
| 5,627,009 | 5/1997 | Maerz et al. | 430/257 |
| 5,840,467 | 11/1998 | Kitatani et al. | 430/302 |
| 5,858,604 | 1/1999 | Takeda et al. | 430/162 |

FOREIGN PATENT DOCUMENTS

| | | |
|---|---|---|
| 0 573 092 A1 | 12/1993 | European Pat. Off. . |
| 0 160 395 A2 | 11/1995 | European Pat. Off. . |
| 0 703 499 A1 | 3/1996 | European Pat. Off. . |

*Primary Examiner*—Janet Baxter
*Assistant Examiner*—Barbara Gilmore
*Attorney, Agent, or Firm*—Breiner & Breiner

[57] ABSTRACT

According to the present invention there is provided a method for making lithographic printing plates including the following steps:

a) preparing a heat mode imaging element having on a lithographic base with a hydrophilic surface a first layer including a polymer, soluble in an aqueous alkaline solution, a compound capable of converting light to heat and a top layer on the same side of the lithographic base as the first layer which top layer is unpenetrable for an alkaline developer containing $SiO_2$ as silicate;
b) exposing imagewise the heat mode imaging element to actinic light;
c) developing the imagewise exposed heat mode imaging element with the alkaline developer so that the exposed areas of the top layer and the underlying areas of the first layer are dissolved and the unexposed areas of the first layer remain undissolved characterized in that said top layer includes an organic quaternary ammonium salt.

12 Claims, No Drawings

METHOD FOR MAKING POSITIVE WORKING PRINTING PLATES FROM A HEAT MODE SENSITIVE IMAGE ELEMENT

The applications claims the benefit of U.S. Provisional Application No. 60/069,954 filed Dec. 17, 1997.

FIELD OF THE INVENTION

The present invention relates to a method for preparing a lithographic printing plate using a heat mode imaging element.

More specifically the invention is related to a method for preparing a lithographic printing plate using a heat mode imaging element whereby the capacity of the top layer of being penetrated and/or solubilized by an aqueous developer is changed upon exposure.

BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the photosensitive coating is not sensitive enough to be directly exposed with a laser. Therefor it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A-60-61 752 but has the disadvantage that a complex development and associated developing liquids are needed.

GB-1 492 070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat mode printing plate precursors is clearly seen on the market.

For example, Research Disclosure no. 33303 of January 1992 discloses a heat mode imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink-acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

U.S. Pat. No. 4,708,925 discloses imaging elements including a photosensitive composition comprising an alkali-soluble novolac resin and an onium-salt. This composition can optionally contain an IR-sensitizer. After image-wise exposing said imaging element to UV—visible—or IR-radiation followed by a development step with an aqueous alkali liquid there is obtained a positive or negative working printing plate. The printing results of a lithographic plate obtained by irradiating and developing said imaging element are poor.

EP-A-625 728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625 728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

Furthermore EP-A-678 380 discloses a method wherein a protective layer is provided on a grained metal support underlying a laser-ablatable surface layer. Upon image-wise exposure the surface layer is fully ablated as well as some parts of the protective layer. The printing plate is then treated with a cleaning solution to remove the residue of the protective layer and thereby exposing the hydrophilic surface layer.

EP-A-97 200 588.8 discloses a heat mode imaging element for making lithographic printing plates comprising on a lithographic base having a hydrophilic surface an intermediate layer comprising a polymer, soluble in an aqueous alkaline solution and a top layer that is sensitive to IR-radiation wherein said top layer upon exposure to IR-radiation has a decreased or increased capacity for being penetrated and/or solubilized by an aqueous alkaline solution. This material does not give a selective dissolution of the exposed or unexposed parts of the top and intermediate layer.

EP-A-703 499 discloses a photosensitive article comprising a substrate having on at least one surface thereof a photosensitive composition which upon irradiation provides surface areas which are, or on press become, more hydrophilic in one area and less hydrophilic in a second area, said one area and said second area being differentiated by being exposed or not exposed to radiation, and having over said photosensitive composition a hydrophilic, non-photosensitive protective layer, said protective layer having a contact angle with water which is less than the contact angle of the photoactive layer with water.

EP-A-160 395 discloses a laser-imageable assembly comprising a transparent substrate having on a surface thereof an energy absorbent transfer layer characterized in that the transfer layer comprises particles which absorb laser energy dispersed in a heterogeneous resin layer.

U.S. Pat. No. 4,946,758 discloses a photosensitive recording material comprising (A) a photopolymerizable relief-forming layer which can be developed with liquid developer after imagewise exposure to actinic light, (B) a top layer which consist of polymers forming films of high tensile strength, adheres firmly to the photopolymerizable relief-forming layer (A) and is soluble or swellable in the liquid developers and (C) a cover sheet which can be readibly peeled off from the top layer (B), the top layer (B) contains specific tertiary amines and/or amides and/or specific quaternary ammonium salts.

The above discussed systems have one or more disadvantages e.g. low infrared sensitivity, need for a pre-heating step (complex processing), are not imageable at short as well as at long pixel dwell times, lack a selective dissolution of the exposed or unexposed parts of the top and intermediate layer or said dissolution(development) is slow. So there is still a need for heat mode imaging materials that can be imaged by laser exposure at short as well as at long pixel dwell times, need short development times and that yields lithographic printing plates with excellent printing properties.

OBJECTS OF THE INVENTION

It is an object of the invention to provide a method for making positive lithographic printing plates from a heat mode sensitive imaging element having excellent printing properties, developable in a selective, rapid convenient and ecological way.

It is further an object of the present invention to provide a method for making positive lithographic printing plates from a heat mode sensitive imaging element having a high infrared sensitivity.

It is also an object of the present invention to provide a method for making positive lithographic printing plates from a heat mode sensitive imaging element wich can be imaged by laser exposure at short as well as at long pixel dwell times.

Further objects of the present invention will become clear from the description hereinafter.

SUMMARY OF THE INVENTION

According to the present invention there is provided a method for making lithographic printing plates including the following steps:

a) preparing a heat mode imaging element having on a lithographic base with a hydrophilic surface a first layer including a polymer, soluble in an aqueous alkaline solution, a compound capable of converting light to heat and a top layer on the same side of the lithographic base as the first layer which top layer is unpenetrable for an alkaline developer containing $SiO_2$ as silicate;

b) exposing imagewise said heat mode imaging element to actinic light;

c) developing said imagewise exposed heat mode imaging element with said alkaline developer so that the exposed areas of the top layer and the underlying areas of the first layer are dissolved and the unexposed areas of the first layer remain undissolved characterized in that said top layer includes an organic quaternary ammonium salt.

DETAILED DESCRIPTION OF THE INVENTION

According to the present invention there is provided a method for making lithographic printing plates including the following steps:

a) preparing a heat mode imaging element having on a lithographic base with a hydrophilic surface a first layer including a polymer, soluble in an aqueous alkaline solution, a compound capable of converting light to heat and a top layer on the same side of the lithographic base as the first layer which top layer is unpenetrable for an alkaline developer containing $SiO_2$ as silicate;

b) exposing imagewise said heat mode imaging element to actinic light;

c) developing said imagewise exposed heat mode imaging element with said alkaline developer so that the exposed areas of the top layer and the underlying areas of the first layer are dissolved and the unexposed areas of the first layer remain undissolved characterized in that said top layer includes an organic quaternary ammonium salt.

The top layer, in accordance with the present invention comprises an organic quaternary ammonium salt. A mixture of organic quaternary ammonium salts may be used, but it is preferred to use only one organic quaternary ammonium salt. Said organic quaternary ammonium salt can be a low molecular compound, preferably containing at least a $C_6$ carbon chain, more preferably containing at least a $C_{12}$ carbon group, still more preferably at least a $C_{12}$ aliphatic group. Most preferable said organic quaternary ammonium salt is a polymer, particularly preferable a poly-p-vinylbenzyltrimethylammonium salt.

The top layer can comprise as binder a water insoluble polymer such as a cellulose ester, a copolymer of vinylidene chloride and acrylonitrile, poly(meth)acrylates, polyvinyl chloride, silicone resins, etc.

The top layer may comprises as a binder resin in accordance with the present invention preferably a water soluble polymer. As water soluble polymer a protein, preferably gelatin may be used. However, also synthetic, semi-synthetic, or natural water soluble polymers may be used. Synthetic polymers are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

The total amount of the top layer preferably ranges from 0.1 to 10 g/$m^2$ more preferably from 0.3 to 2 g/$m^2$.

In the top layer a difference in the capacity of being penetrated and/or solubilized by the aqueous alkaline solution is generated upon image-wise exposure for an alkaline developer according to the invention.

In the present invention the said capacity is increased upon image-wise exposure to actinic light to such degree that the imaged parts will be cleaned out during development without solubilizing and/or damaging the non-imaged parts.

The development with the aqueous alkaline solution is preferably done within an interval of 5 to 120 seconds.

The top layer or the layer just underlying said top layer includes a compound capable of converting light to heat. Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

Other favorable dyes are IR-cyanine dyes. A mixture of IR-cyanine dyes may be used, but it is preferred to use only one IR-cyanine dye. Particularly useful IR-cyanine dyes are cyanines dyes with two acid groups, more preferably with two sulphonic groups. Still more preferably are cyanines dyes with two indolenine and two sulphonic acid groups. Most preferably is compound I with the structure as indicated:

(I)

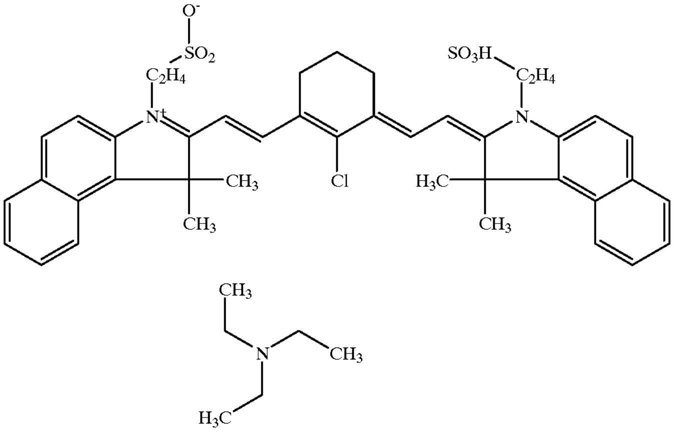

The ratio in weight between the organic quaternary ammonium salt and the compound capable of converting light into heat is preferably between 98:2 to 20:80, more preferably between 95:5 to 50:50.

Between the top layer and the lithographic base the present invention comprises a first layer soluble in an aqueous developing solution, more preferably an aqueous alkaline developing solution with preferentially a pH between 7.5 and 14. Said layer is preferably contiguous to the top layer but other hydrophilic layers can be present between the top layer and the first layer. The alkali soluble binders used in this layer are preferably hydrophobic binders as used in conventional positive or negative working PS-plates e.g. novolac, polyvinyl phenols, carboxy substituted polymers etc. Typical examples of these polymers are described in DE-A-4 007 428, DE-A-4 027 301 and DE-A-4 445 820. The hydrophobic binder used in connection with the present invention is further characterized by insolubility in water and partial solubility/swellability in an alkaline solution and/or partial solubility in water when combined with a cosolvent. Furthermore this aqueous alkali soluble layer is preferably a visible light- or UV-light desensitized layer. Still further said layer is preferably thermally hardenable. This preferably visible light- or UV-light desensitized layer does not comprise photosensitive ingredients such as diazo compounds, photoacids, photoinitiators, quinone diazides, sensitizers etc. which absorb in the wavelength range of 250 nm to 650 nm. In this way a daylight stable printing plate can be obtained.

Said first layer preferably also includes a low molecular acid, preferably a carboxylic acid, still more preferably a benzoic acid, most preferably 3,4,5-trimethoxybenzoic acid.

The weight ratio between the total amount of low molecular acid and polymer in the first layer preferably ranges from 2:98 to 40:60, more preferably from 5:95 to 20:80. The total amount of said first layer preferably ranges from 0.1 to 10 g/$m^2$, more preferably from 0.3 to 2 g/$m^2$.

In the imaging element according to the present invention, the lithographic base can be an anodized aluminum. A particularly preferred lithographic base is an electrochemically grained and anodized aluminum support. The anodized aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment in connection with the present invention, the lithographic base having a hydrophilic surface comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolyzed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, more preferably between 0.5 and 5 parts by weight, most preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stbber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 μm and is preferably 1 to 10 μm.

Particular examples of suitable cross-linked hydrophilic layers for use in accordance with the present invention are disclosed in EP-A-601 240, GB-P-1 419 512, FR-P-2 300 354, U.S. Pat. No. 3,971,660, U.S. Pat. No. 4,284,705 and EP-A-514 490.

As flexible support of a lithographic base in connection with the present embodiment it is particularly preferred to use a plastic film e.g. substrated polyethylene terephthalate film, cellulose acetate film, polystyrene film, polycarbonate film etc . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

In order to obtain a lithographic plate the heat mode imaging element according to the invention is first image-wise exposed to actinic light and then developed in an aqueous solution.

Actinic light is light that is absorbed by the compound converting light into heat.

Image-wise exposure in connection with the present invention is preferably an image-wise scanning exposure involving the use of a laser that operates in the infrared or near-infrared, i.e. wavelength range of 700–1500 nm. Most preferred are laser diodes emitting in the near-infrared. Exposure of the imaging element can be performed with lasers with a short as well as with lasers with a long pixel dwell time. Preferred are lasers with a pixel dwell time between 0.005 μs and 20 μs.

After the image-wise exposure the heat mode imaging element is developed by rinsing it with an aqueous alkaline solution. The aqueous alkaline solutions used in the present invention are those that are used for developing conventional positive working presensitized printing plates and have preferably a pH between 11.5 and 14. Thus the imaged parts of the top layer that were rendered more penetrable for the aqueous alkaline solution upon exposure and the corresponding parts of the underlying layer are cleaned-out whereby a positive working printing plate is obtained.

In the present invention, the composition of the developer used is also very important.

Therefore, to perform development processing stably for a long time period particularly important are qualities such as strength of alkali and the concentration of silicates in the developer. Under such circumstances, the present inventors have found that a rapid high temperature processing can be performed, that the amount of the replenisher to be supplemented is low and that a stable development processing can be performed over a long time period of the order of not less than 3 months without exchanging the developer only when the developer having the foregoing composition is used.

The developers and replenishers for developer used in the invention are preferably aqueous solutions mainly composed of alkali metal silicates and alkali metal hydroxides represented by MOH or their oxyde, represented by $M_2O$, wherein said developer comprises $SiO_2$ and $M_2O$ in a molar ratio of 0.5 to 1.5 and a concentration of $SiO_2$of 0.5 to 5% by weight. As such alkali metal silicates, preferably used are, for instance, sodium silicate, potassium silicate, lithium silicate and sodium metasilicate. On the other hand, as such alkali metal hydroxides, preferred are sodium hydroxide, potassium hydroxide and lithium hydroxide.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono- or di-isopropylamine, n-butylamine, mono-, di- or triisopropanolamine, ethyleneimine, ethylenediimine and tetramethylammonium hydroxide.

In the present invention, particularly important is the molar ratio in the developer of $[SiO_2]/[M_2O]$, which is generally 0.5 to 1.5, preferably 0.7 to 1.3. This is because if the molar ratio is less than 0.5, great scattering of activity is observed, while if it exceeds 1.5, it becomes difficult to perform rapid development and the dissolving out or removal of the light-sensitive layer on exposed areas is liable to be incomplete. In addition, the concentration of $SiO_2$ in the developer and replenisher preferably ranges from 1 to 4% by weight. Such limitation of the concentration of $SiO_2$ makes it possible to stably provide lithographic printing plates having good finishing qualities even when a large amount of plates according to the invention are processed for a long time period.

In a particular preferred embodiment, an aqueous solution of an alkali metal silicate having a molar ratio $[SiO_2]/[M_20]$, which ranges from 1.0 to 1.5 and a concentration of $SiO_2$ of 1 to 4% by weight is used as a developer. In such case, it is a matter of course that a replenisher having alkali strength equal to or more than that of the developer is employed. In order to decrease the amount of the replenisher to be supplied, it is advantageous that a molar ratio, $[SiO_2]/[M_2O]$, of the replenisher is equal to or smaller than that of the developer, or that a concentration of $SiO_2$ is high if the molar ratio of the developer is equal to that of the replenisher.

In the developers and the replenishers used in the invention, it is possible to simultaneously use organic solvents having solubility in water at 20° C. of not more than 10% by weight according to need. Examples of such organic solvents are such carboxilic acid esters as ethyl acetate, propyl acetate, butyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenzene. These organic solvents may be used alone or in combination. Particularly preferred is benzyl alcohol in the invention. These organic solvents are added to the developer or replenisher therefor generally in an amount of not more than 5% by weight and preferably not more than 4% by weight.

The developers and replenishers used in the present invention may simultaneously contain a surfactant for the purpose of improving developing properties thereof. Examples of such surfactants include salts of higher alcohol (C8~C22) sulfuric acid esters such as sodium salt of lauryl alcohol sulfate, sodium salt of octyl alcohol sulfate, ammonium salt of lauryl alcohol sulfate, Teepol B-81 (trade mark, available from Shell Chemicals Co., Ltd.) and disodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnaphthalene sulfonate,sodium salt of dinaphthalene disulfonate and sodium salt of metanitrobenzene sulfonate; sulfonic acid salts of alkylamides such as $C_{17}H_{33}CON(CH_3)CH_2CH_2SO_3Na$ and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

In order to enhance developing stability of the developers and replenishers used in the invention, the following compounds may simultaneously be used.

Examples of such compounds are neutral salts such as NaCl, KCl and KBr as disclosed in JN-A-58-75 152; chelating agents such as EDTA and NTA as disclosed in JN-A-58-190 952 (U.S. Pat. No. 4,469,776), complexes such as [Co(NH3)6]Cl3 as disclosed in JN-A-59-121 336 (U.S. Pat. No. 4,606,995); ionizable compounds of elements of the group IIa, IIIa or IIIb of the Periodic Table such as those disclosed in JN-A-55-25 100; anionic or amphoteric surfactants such as sodium alkyl naphthalene sulfonate and N-tetradecyl-N,N-dihydroxythyl betaine as disclosed in JN-A-50-51 324; tetramethyldecyne diol as disclosed in U.S. Pat. No. 4,374,920; non-ionic surfactants as disclosed in JN-A-60-213 943; cationic polymers such as methyl chloride quaternary products of p-dimethylaminomethyl polystyrene as disclosed in JN-A-55-95 946; amphoteric polyelectrolytes such as copolymer of vinylbenzyl trimethylammonium chloride and sodium acrylate as disclosed in JN-A-56-142 528; reducing inorganic salts such as sodium sulfite as disclosed in JN-A-57-192 952 (U.S. Pat. No. 4,467,027) and alkaline-soluble mercapto compounds or thioether compounds such as thiosalicylic acid, cysteine and thioglycolic acid; inorganic lithium compounds such as lithium chloride as disclosed in JN-A-58-59 444; organic lithium compounds such as lithium benzoate as disclosed in JN-A-50 34 442; organometallic surfactants containing Si, Ti or the like as disclosed in JN-A-59-75 255; organoboron compounds as disclosed in JN-A-59-84 241 (U.S. Pat. No. 4,500,625); quaternary ammonium salts such as tetraalkylammonium oxides as disclosed in EP-A-101 010; and bactericides such as sodium dehydroacetate as disclosed in JN-A-63-226 657. In the method for development processing of the present invention, any known means of supplementing a replenisher for developer may be employed. Examples of such methods preferably used are a method for intermittently or continuously supplementing a replenisher as a function of the amount of PS plates processed and time as disclosed in JN-A-55-115 039 (GB-A-2 046 931), a method comprising disposing a sensor for detecting the degree of light-sensitive layer dissolved out in the middle portion of a developing zone and supplementing the replenisher in proportion to the detected degree of the light-sensitive layer dissolved out as disclosed in JN-A-58-95 349 (U.S. Pat. No. 4,537,496); a method comprising determining the impedance value of a developer and processing the detected impedance value by a computer to perform supplementation of a replenisher as disclosed in GB-A-2 208 249.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Nieuws" ed. Keesing, 15, 1995, page 4 to 6.

After the development of an image-wise exposed imaging element with an aqueous alkaline solution and drying, the obtained plate can be used as a printing plate as such. However, to improve durability it is still possible to bake said plate at a temperature between 200° C. and 300° C. for a period of 30 seconds to 5 minutes. Also the imaging element can be subjected to an overall post-exposure to UV-radiation to harden the image in order to increase the run lenght of the printing plate.

The following examples illustrate the present invention without limiting it thereto. All parts and percentages are by weight unless otherwise specified.

EXAMPLES

EXAMPLE 1

Positive Working Thermal Plate Based on an Alkali-Soluble Binder.

Preparation of the Lithographic Base

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 mm.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$ then washed with demineralized water, posttreated with a solution containing polyvinylphosphonic acid and then with a solution containing aluminum trichloride, subsequently rinsed with demineralized water at 20° C. during 120 seconds and dried.

Preparation of the First Layer

To 740 g of tetrahydrofuran and 503 g of methoxypropanol was added a solution of 48 g alnovol in 74 g of methoxypropanol and 6.55 g of 3,4,5-trimethoxybenzoic acid and said solution was coated on the anodized layer of the aluminum support at a wet thickness of 20 $\mu$m, giving a dry weight of 0.76 $g/m^2$.

Preparation of the Top Layer

On the first layer was coated a layer from an aqueous dispersion containing 0.10 $g/m^2$ of carbon black (trade name Printex L6) and 0.90 $g/m^2$ poly-p-vinylbenzyltrimethylammonium chloride (trade name DowECR77 from Dow Chemicals).

This material was imaged with an external drum IR-laser imaging apparatus (diode laser 830 nm, drumspeed 3.2 m/s, addressability 3600 dpi, power level in image plane 80–120 mW), and developed in an alkaline silicate containing developing solution (75% EP 26 developer commercially available from Agfa), containing 1.16 weight percent of $SiO_2$ and a molar ratio of $[SiO_2]$ to $[Na_2O]$ of 0.59., dissolving very rapidly the exposed parts At 2400 dpi images were obtained with this material using 80 mW power or more in imageplane. This plate was printed on a Heidelberg GTO 46 printing machine with a conventional ink (K+E197) and fountain solution (Rotamatic) resulting in good prints, i.e. no scumming in non imaged parts and good ink-uptake in imaged parts.

EXAMPLE 2

Positive Working Thermal Plate Based on an Alkali-Soluble Binder.

A heat mode material was prepared in an identical way as the material described above except that the top layer contained 0.15 $g/m^2$ of carbon black (trade name Printex L6) and 0. 85 $g/m^2$ poly-p-vinylbenzyltrimethylammonium chloride (trade name DowECR77 from Dow Chemicals).

This material was imaged with an external drum IR-laser imaging apparatus (diode laser 830 nm, drumspeed 3.2 m/s, addressability 3600 dpi, power level in image plane 80–120 mW), and developed in an alkaline silicate containing developing solution (75% EP 26 developer commercially available from Agfa), containing 1.16 weight percent of $SiO_2$ and a molar ratio of $[SiO_2]$ to $[Na_2O]$ of 0.59.dissolving very rapidly the exposed parts.

At 2400 dpi images were obtained with this material using 80 mW power or more in imageplane. This plate was printed on a Heidelberg GTO 46 printing machine with a conventional ink (K+E197) and fountain solution (Rotamatic) resulting in good prints, i.e. no cumming in non imaged parts and good ink-uptake in imaged parts.

We claim:

1. A method for making lithographic printing plates including the following steps:

a) preparing a heat mode imaging element having on a lithographic base with a hydrophilic surface a first layer including a polymer, soluble in an aqueous alkaline solution, a compound capable of converting light to heat and a top layer on the same side of the lithographic base as the first layer which top layer is unpenetrable for an alkaline developer containing $SiO_2$ as silicate and which top layer includes an organic quaternary ammonium salt;

b) exposing imagewise said heat mode imaging element to actinic light;

c) developing said imagewise exposed heat mode imaging element with said alkaline developer so that the exposed areas of the top layer and the underlying areas of the first layer are dissolved and the unexposed areas of the first layer remain undissolved;

wherein said organic quaternary ammonium salt is a low molecular compound containing at least a $C_6$ carbon chain.

2. A method for making lithographic printing plates according to claim 1 wherein said organic quaternary ammonium salt is a low molecular compound containing at least a $C_{12}$ carbon chain.

3. A method for making lithographic printing plates according to claim 2 wherein said organic quaternary ammonium salt is a low molecular compound containing at least a $C_{12}$ aliphatic chain.

4. A method for making lithographic printing plates according to claim 1 wherein said organic quaternary ammonium salt is a polymer.

5. A method for making lithographic printing plates according to claim 4 wherein said organic quaternary ammonium salt is a poly-p-vinylbenzyltrimethylammonium salt.

6. A method for making lithographic printing plates according to claim 1 wherein the ratio in weight between the organic quaternary ammonium salt and the compound capable of converting light into heat is between 98:2 to 20:80.

7. A method for making lithographic printing plates according to claim 1 wherein said compound capable of converting light into heat is carbon black.

8. A method for making lithographic printing plates according to claim 1 wherein said compound capable of converting light into heat is an IR-cyanine dye.

9. A method for making lithographic printing plates according to claim 1 wherein said alkaline developer contains $SiO_2$ and $M_2O$ in a molar ratio of 0.5 to 1.5 and a concentration of $SiO_2$ of 0.5 to 5% by weight, wherein $M_2O$ is an alkali metal oxide.

10. A method for making lithographic printing plates according to claim 9 wherein said imagewise exposed heat mode imaging element is developed with an alkaline developer containing $SiO_2$ in the range from 1 to 4% by weight.

11. A method for making lithographic printing plates according to claim 9 wherein said imagewise exposed heat mode imaging element is developed with an alkaline developer containing $SiO_2$ and $M_2O$ in a molar ratio of 0.7 to 1.3, wherein $M_2O$ is an alkali metal oxide.

12. A method for making lithographic printing plates according to claim 1 wherein the polymer of the first layer is novolac.

* * * * *